United States Patent [19]
Bryant

[11] Patent Number: 5,349,401
[45] Date of Patent: Sep. 20, 1994

[54] ORIENTATION INDEPENDENT, DETACHABLE FILM CARTRIDGE, MEMORY MODULE

[75] Inventor: Robert S. Bryant, Rochester, N.Y.

[73] Assignee: Eastman Kodak Company, Rochester, N.Y.

[21] Appl. No.: 71,096

[22] Filed: Jun. 4, 1993

[51] Int. Cl.$^5$ .............................................. G03B 7/00
[52] U.S. Cl. ...................................................... 354/21
[58] Field of Search ............................................ 354/21

[56] References Cited

U.S. PATENT DOCUMENTS

| | | | |
|---|---|---|---|
| 4,038,599 | 7/1977 | Bove et al. | 324/158 F |
| 4,443,077 | 4/1984 | Tanikawa | 354/21 |
| 4,500,183 | 2/1985 | Tanikawa | 354/21 |
| 4,806,959 | 2/1989 | Townsend | 354/21 |
| 4,887,105 | 12/1989 | Ishikawa et al. | 354/21 |
| 4,945,365 | 7/1990 | Fujino | 354/21 |
| 4,947,196 | 8/1990 | Wash et al. | 354/76 |
| 4,962,397 | 10/1990 | Ishikawa et al. | 354/21 |
| 4,965,626 | 10/1990 | Robison et al. | 355/40 |
| 5,016,030 | 5/1991 | Dwyer et al. | 354/21 |
| 5,032,854 | 7/1991 | Smart et al. | 354/21 |
| 5,032,855 | 7/1991 | Taniguchi et al. | 354/21 |
| 5,036,344 | 7/1991 | Inoue et al. | 354/106 |
| 5,070,355 | 12/1991 | Inoue et al. | 354/413 |
| 5,097,279 | 3/1992 | Sakamoto et al. | 354/106 |
| 5,142,310 | 8/1992 | Taniguchi et al. | 354/106 |

Primary Examiner—M. L. Gellner
Assistant Examiner—Nicholas J. Toccillo
Attorney, Agent, or Firm—David M. Woods

[57] ABSTRACT

A system for recording information related to the camera exposure parameters of film image frames in a detachable, disc-shaped, memory module attached to the end of a film cartridge loaded in the camera in non-volatile memory for subsequent read-out. A set of concentric, circular, conductive bands are spaced apart and electrically isolated from one another on the exposed surface of the disc-shaped module housing. An integrated circuit chip, including a non-volatile memory, within the module, has a plurality of input and output terminals connected to the plurality of concentric conductive bands. A camera receives the film cartridge and attached memory module in a cartridge receiving chamber and has a plurality of contact terminals positioned to make electrical contact with the respective plurality of concentric conductive bands. The camera electronic operating system provides the battery power and electrical signals to be stored in the non-volatile memory through contact of the plurality of contact terminals with the respective concentric conductive bands. The stored data may be read out through the concentric, circular, conductive bands and employed in processing and/or making prints from the film in the cartridge.

6 Claims, 3 Drawing Sheets

ORIENTATION INDEPENDENT, DETACHABLE FILM CARTRIDGE, MEMORY MODULE

CROSS-REFERENCE TO RELATED APPLICATIONS

This application discloses subject matter related to subject matter disclosed in commonly assigned U.S. Pat. application Ser. No. 09/,071,084 entitled ORIENTATION INDEPENDENT, DETACHABLE FILM CARTRIDGE, MEMORY MODULE filed on even date herewith in the name of J. David Cocca.

1. Field of the Invention

This invention relates to the field of photographic film cameras and film processing, and particularly to apparatus for providing non-volatile, electronic information storage and retrieval capabilities for a standard film cartridge.

2. Background of the Invention

As set forth in commonly assigned U.S. Pat. No. 5,032,854 to Smart et al., it is well known to provide limited information relating to film type and speed by means of a DX code or bar code imprinted on the exterior case or end of the film cartridge that may be electrically or optically read in to the camera's electronic control system. Such well known coding is employed to set exposure parameters of the camera automatic exposure control system, but is not useful in storing information related to the actual exposure made of an individual image frame in use of the camera.

In order to store such information, as well as the image frame identification to which it pertains, and other information automatically entered from the camera operating system or optionally entered by the camera user, it is necessary to employ a further writable and readable media in association with either the film or the film cartridge.

For example, commonly assigned U.S. Pat. Nos. 4,965,626 and 5,016,030 to Robinson et al. and Dwyer et al. (and applications listed therein) disclose photographic film incorporating magnetic read/write strips and read/write heads and systems incorporated into cameras and photofinishing equipment for storing and reading out a wide variety of data.

Alternatively, it has been proposed to magnetically read and write data on magnetic strips formed on the sides or an end of the film cartridge, as described, for example, in U.S. Pat. No. 4,443,077 to Tanikawa.

More recently, it has been suggested that data may be stored and retrieved from non-volatile memory chips, e.g. an EEPROM, incorporated in an integrated circuit chip "card" as set forth in U.S. Pat. No. 5,036,344 to Inoue et al. The card may be separable from the camera and film cartridge or may be attached to the film cartridge as set forth generally in U.S. Pat. No. 5,070,355 to Inoue et al.

Alternatively, the storage of such information in "ROM-ICs" attached permanently or releasably to the sides or ends of film cartridges is disclosed in U.S. Pat. No. 5,032,855 to Taniguchi et al. The various embodiments of the ROM-ICs illustrated in the '855 patent are adapted to have a pattern of electrically conductive contact pads recessed in holes that are adapted to receive spring-loaded terminals when the cartridge is correctly positioned in the camera body or photofinishing equipment. The disclosed system operates to store and retrieve data from an EEPROM in the ROM-IC during the exposure of the film in the cartridge and its subsequent processing and the print making.

The disclosed embodiments of the '855 patent appear to require that the film cartridge be especially designed to have a film containing section and a ROM-IC containing section that is either permanently attached or releasably attached to the end of the cylindrical film cartridge. The releasable attachment methods presented appear to be positionally sensitive to obtain a precise orientation of the pattern of access holes and contact pads to the array of terminals. In order to facilitate this alignment, the film cartridges illustrated and described appear to be modified from the standard 35 mm cartridge.

The introduction of modified or non-standard film cartridges presents difficulties in acceptance and increases costs of manufacturing, distributing and stocking and may lead to customer confusion and dissatisfaction. The use of positionally sensitive end fitting modules as disclosed in the '855 patent leads to difficulties in accurately positioning the modules and errors in use.

SUMMARY OF THE INVENTION

It is therefore an object of the present invention to provide a read/write memory module for releasable attachment to the end of a film cartridge that may be employed with standard film cartridges and is not positionally sensitive.

In accordance with these and other objects of the present invention, a memory module for a film cartridge in which information related to the camera exposure of film image frames may be recorded in non-volatile memory for subsequent read-out is provided comprising: a disc-shaped module housing having an upper and a lower surface and a diameter generally corresponding to the diameter of an end of the film cartridge; a printed circuit formed in the pattern of a plurality of concentric, circular conductive bands spaced apart and electrically isolated from one another on the upper surface of the disc-shaped module housing; an integrated circuit chip, including a non-volatile memory, attached to the lower surface of the disc-shaped module housing and having a plurality of input and output terminals; means for making electrical connections between the plurality of input and output terminals of the integrated circuit chip and the plurality of concentric conductive bands; and means for attaching the disc-shaped module housing to the end of a film cartridge so that the upper surface is exposed for making electrical contact with data recording and reading terminals of camera and film processing equipment.

In accordance with the invention, the attaching means further comprises a disc-shaped layer of insulating material having a first surface for contacting and enclosing the integrated circuit chip and a second surface for contacting the end of the film cartridge, the second surface having an adhesive layer thereon for adhering the memory module to the end of the film cartridge.

In use, the detachable memory module is employed in a system for recording information related to the camera exposure parameters of film image frames for subsequent read-out, wherein the camera further comprises: a camera housing for receiving the film cartridge with the attached memory module in a cartridge receiving chamber; a plurality of contact terminals positioned by the camera housing to extend into the cartridge receiving chamber and bear against and make electrical contact with the respective plurality of concentric conductive bands; and means for providing camera battery power and electrical signals to be stored in the non-volatile memory through the plurality of contact terminals and to the respective concentric conductive bands.

The memory module of the present invention may advantageously employed in such a camera and in associated photofinishing equipment to store the wide variety of data described in the above referenced patents. More particularly, the memory module of the present invention may be readily attached to the end of a standard film cartridge in any position thereon since the conductive bands on the upper surface thereof are not positionally sensitive and contact may be made with the associated read/write contact terminals even if the attachment is somewhat off center.

BRIEF DESCRIPTION OF THE DRAWINGS

These and other objects, advantages and features of the invention will be become apparent from the detailed description given hereinafter in relation to the accompanying drawings, in which.

The drawings are not necessarily to scale.

DETAILED DESCRIPTION OF THE PREFERRED EMBODIMENTS OF THE INVENTION

Figure 1:
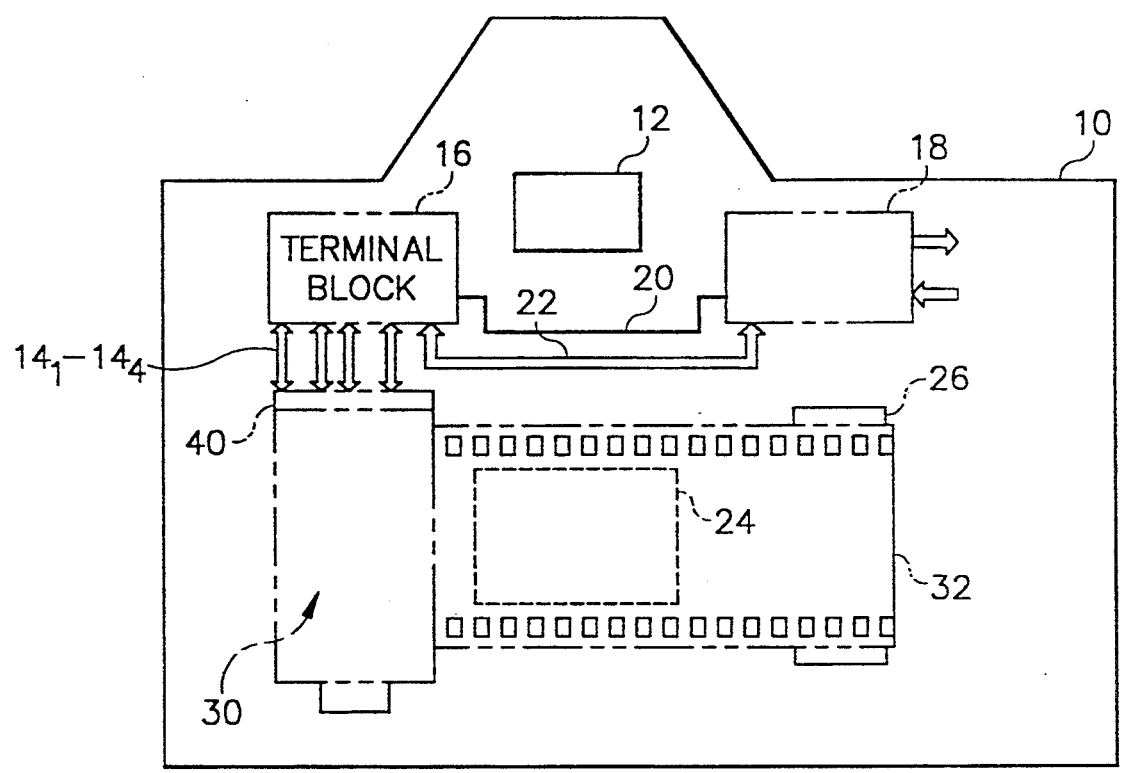
FIG. 1 is a schematic elevation view depicting the relation of a camera body and film cartridge and the terminals for making contact with the memory module of the present invention.

Turning now to FIG. 1, it illustrates schematically the relationship of a camera body 10 and viewfinder 12 with respect to a loaded film cartridge 30 having a memory module 40 attached at one end thereof. The memory module 40, when installed, is in electrical contact (in a manner described hereafter) with a terminal set $14_1$–$14_4$ of four terminal pins that are coupled to the camera electronic operating system including the camera electronic control system 18.

The film cartridge 30 has a length of film 32 withdrawn from it and extended across the camera exposure platen 24 and wound on the spool 26 in the typical film loading cavity of the camera body 10. The camera body 10 is modified in accordance with the invention by the incorporation of the terminal set $14_1$–$14_4$ that extends into contact with concentric conductive bands formed on the upper surface of the memory module 40. In this regard, the individual terminals of the set may take the form of spring-loaded, bullet nose pins extending from spring and pin retaining receptacles through a non-conductive retainer wall into the camera body receptacle for the film cartridge 30 as shown in the above-referenced '855 patent. The insertion of the cartridge 30 into the receptacle causes the bullet nose ends of the pins of the terminal set $14_1$–$14_4$ to retract against their springs while riding in contact on the upper surface of the memory module 40.

Figure 2:
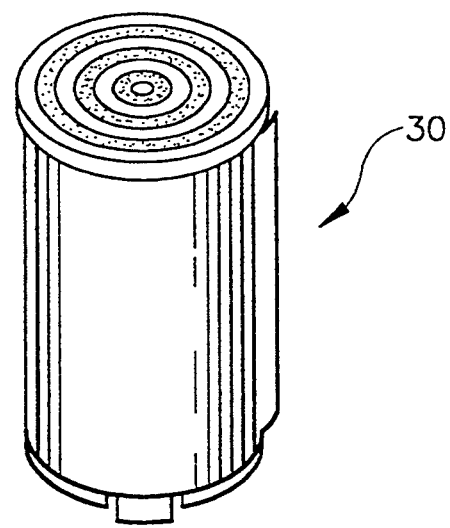
FIG. 2 is an illustration of the memory module in relation to a film cartridge.
Figure 3:
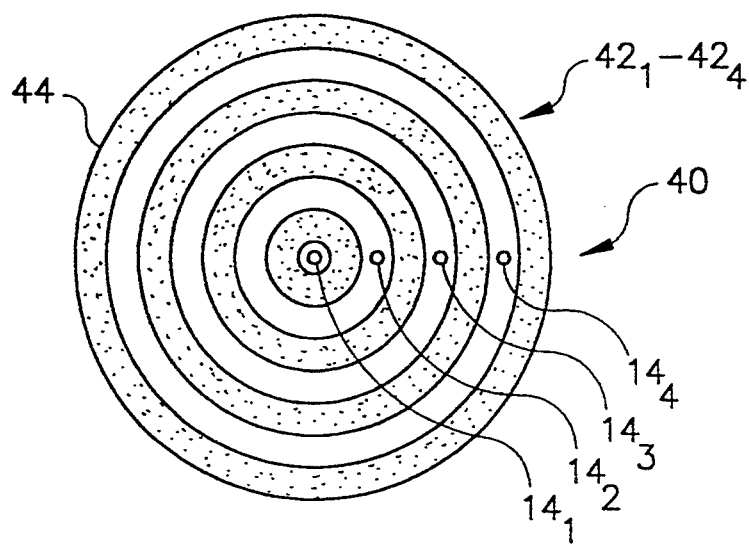
FIG. 3 is top view of the memory module depicting the concentric ring-shaped conductive pattern of the upper surface of the memory module.

Turning now to FIGS. 2 and 3, they depict the relationship of the memory module 40 to the cartridge 30 and the configuration of the concentric, ring-shaped, conductive bands $42_1$–$42_4$ formed as printed circuits on the upper surface 44 of the disc-shaped module housing 46. The disc-shaped module housing 46 has an upper surface 44 and a lower surface 48 and a diameter generally corresponding to the diameter of an end of the film cartridge 30. The conductive band $42_1$ is a solid circular conductive dot at the center of the disc-shaped module housing 46. Each of the conductive bands $42_1$–$42_4$ is separated and electrically insulated from the neighboring band by a non-conductive barrier band $50_1$–$50_4$.

Each conductive band $42_1$–$42_4$ is of a width that is greater than the diameter of the contacting end of the bullet nose shaped ends of the pins of the terminal set $14_1$–$14_4$, shown in contact in FIG. 3, so that a fit tolerance is effective to allow for the attachment of the memory module housing 46 somewhat off-center with respect to the end of the film cartridge 30. Too great an off-center attachment error is prevented simply because the so-attached module housing 46 would prevent the insertion of the cartridge 30 into the receptacle in the camera body 10.

Figure 4:
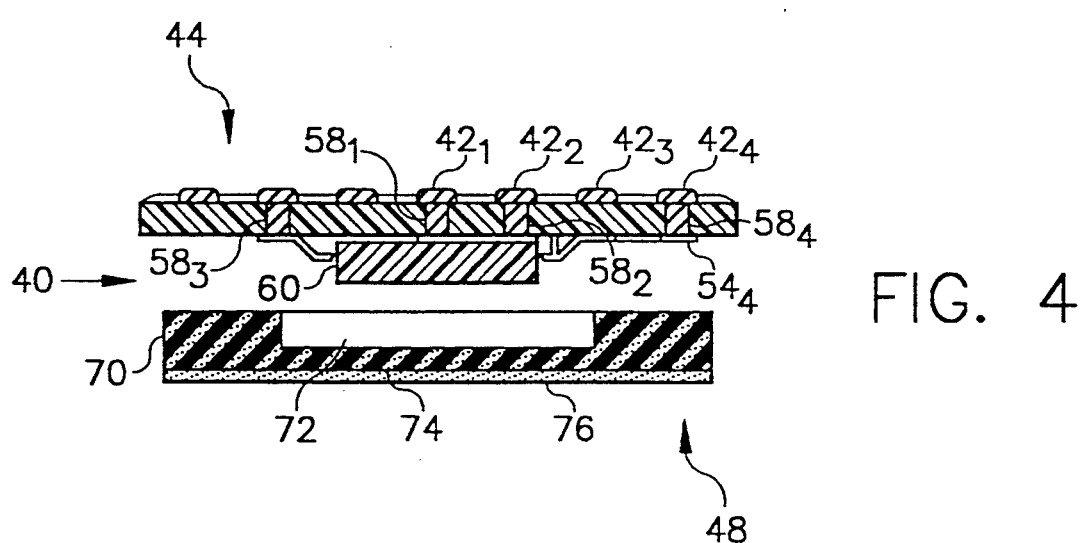
FIG. 4 is a cross-section elevation view of the memory module of the present invention showing the package for the integrated circuit memory contained therein.

FIG. 4 depicts a side cross-section view of the interior components of the memory module housing 46 which, when assembled, form the memory module 40. A disc-shaped upper printed circuit board 46' has the plurality of concentric, circular conductive bands $42_1$–$42_4$ spaced apart and electrically isolated from one another on the upper surface 44 as described above. An integrated circuit chip, e.g. a non-volatile EEPROM chip 60, is attached to the lower surface 48 of the printed circuit board 46' and has a plurality of input and output terminals that are electrically connected by lead wires $52_1$–$52_4$ to printed circuits $54_1$–$54_4$ formed on the lower surface 48. The upper surface conductive bands $42_1$–$42_4$ and lower surface printed circuits $54_1$–$54_4$ are connected together through the printed circuit board 46'.

Figure 5:
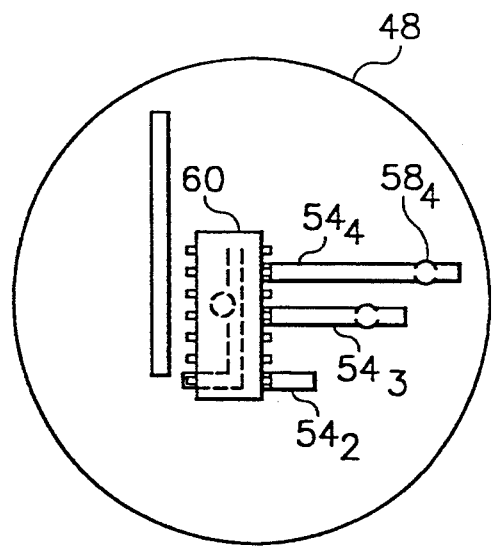
FIG. 5 is a schematic illustration of the EEPROM integrated circuit incorporated into the memory module.

A schematic illustration of the positioning of the components on the lower printed circuit board surface 48 appears in FIG. 5. The printed circuits $54_1$–$54_4$ formed on the lower surface 48 extend outwardly to the through-holes $58_1$–$58_4$ which extend to the respective upper surface conductive bands $42_1$–$42_4$ and are filled with conductive material. The EEPROM chip 60 may be a XICOR 24C16 or any similar EEPROM.

Figure 6:
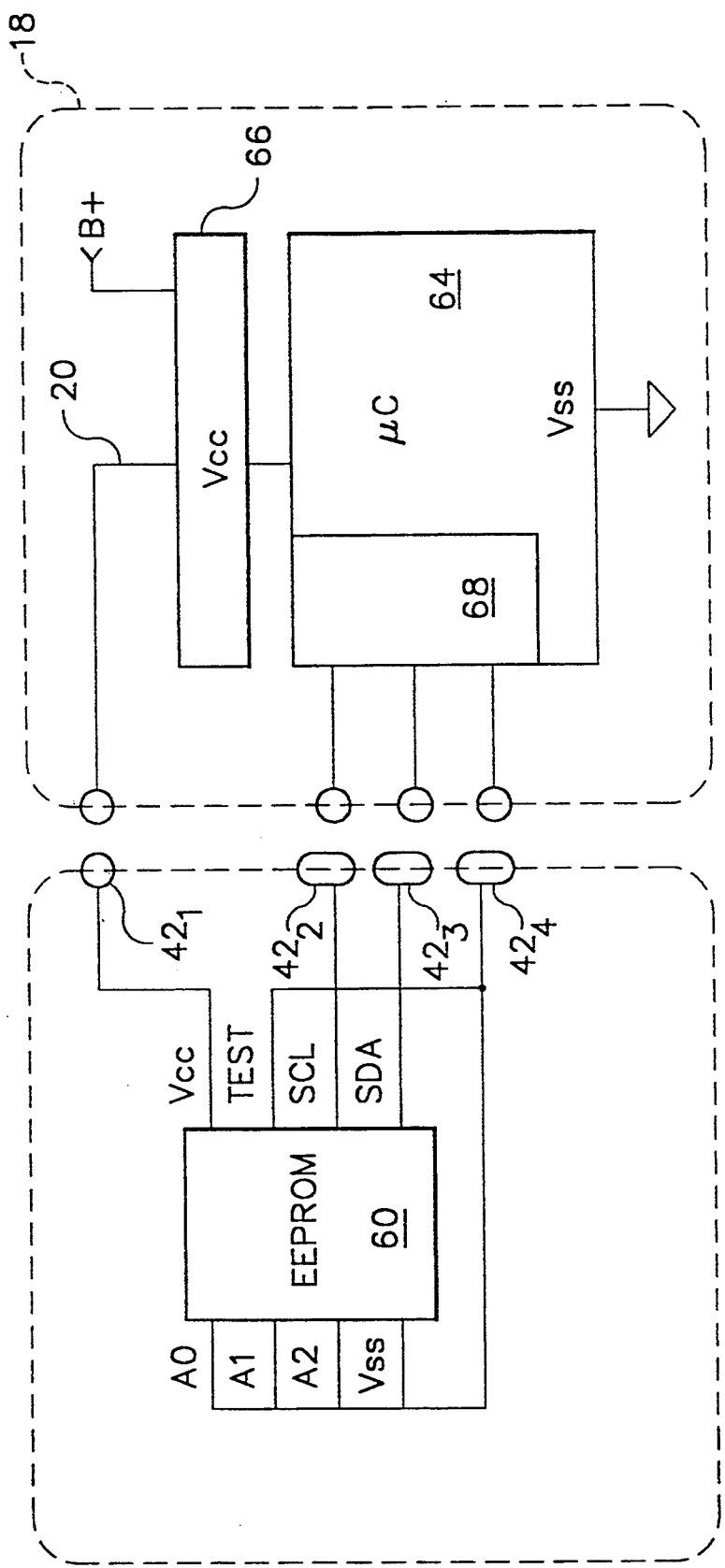
FIG. 6 is a circuit diagram of the interconnection of the EEPROM and the read/write circuit.

The EEPROM chip 60 has eight terminals wired as shown in FIG. 6 that are connected to the printed circuits $54_1$–$54_4$ for the regulated voltage Vcc ($54_1$), clock SCL ($54_2$), serial data SDA ($54_3$) and system ground Vss ($54_4$) signals. Data is stored and read from the EEPROM 60 under the control of the microcontroller 64 which is coupled through its I/O port section 68 and lines 22 to the terminal pins $14_2$–$14_4$ and which enables voltage regulator 66 to apply regulated voltage Vcc on line 20 to terminal pin $14_1$. The EEPROM 60 may be any suitable integrated circuit memory device including the Mitsubishi M38223M4, having internal pull-up resistors and sufficient output current sinking capability to power the EEPROM 60, or a Motorola M68HC11A8. More than one port pin of the lower current sinking capability Motorola microprocessor may be connected in parallel to the terminal pin $14_4$ if necessary.

In order to conform to the I²C standard, pull-up resistors must be present on the SDA and SCL control lines. The microcontroller 64 of the camera electronic control system 18 has internally programmable pull-up resistors that principally function to enable proper serial communication with the EEPROM 60. After identification of the port pins connected with the SCL and SDA terminals, the pull-up resistors for the respective port pins connected thereto are programmed in so that these port pins are set to be at a fixed logic level, e.g. 1 or 0. The fixed logic level keeps the I/0 port pin from drifting between clock and data transmissions. Pull-up resistors are not programmed in for the port pin or port pins coupled to the Vss terminal to avoid increasing current consumption demands on the EEPROM 60.

After the memory module 40 and cartridge 30 are positioned as shown in FIG. 1, the electrical connection may be tested by an attempt to read or write data into or from the EEPROM 60. The failure to receive an acknowledge bit signal from the EEPROM may be employed to indicate a failure on a view screen of the camera, alerting the photographer to check for the accurate positioning of the memory module 40 on the end of the cartridge.

Returning to FIG. 4, a layer of insulating, compressible foam material formed in the shape of a foam disc 70, having a recess 72 in its upper surface, contacts and is adhered to the lower surface of the printed circuit board 46' and also encloses the integrated circuit chip 60. The lower foam disc surface 74 has an releasable contact adhesive layer 76 thereon for adhering the memory module to the end of the film cartridge 30. This provides a simple means for releasably attaching the disc-shaped memory module housing 46 to the end of the film cartridge 30 so that the upper surface conductive bands are exposed for making electrical contact with the data recording and reading terminal set $14_1$–$14_4$ of the camera body 10 and other film processing equipment.

It will be understood that the attachment mechanism may take other forms, e.g. a snap-on cap fitting over or within the rim of the film cartridge 30, that can be releasably attached in any orientation. Although the invention is described as having particular application to releasable memory modules, it will be understood that the module could be permanently attached to the film cartridge 30.

In use, the detachable memory module 40 is employed in a camera electronic control system for recording information of the type itemized in the above referenced patents related to the camera exposure parameters of film image frames for subsequent read-out and for other uses as set forth therein. Pre-recorded data may be stored in the memory module specific to various film types and retrieved by the microcontroller for use in the camera electronic control system with respect to the particular type of film (otherwise read-out by the camera) that the module is attached to for use with other data derived from the camera operating systems to affect exposure of each image frame.

Although the invention is described as having particular application to releasable memory modules, it will be understood that the module could be permanently attached to the film cartridge 30.

The attachment of the memory module 40 to the end of the film cartridge 30 is position insensitive, within the general constraint of fitting it centrally to the end of the cartridge. Moreover, attachment is not dependent on the particular configuration of the end nor does it have to be permanent or require modification of standard film cartridges. Consequently, the memory-module may be readily implemented for use with cameras designed with the read/write capability described above but otherwise capable of accepting standard film cartridges with or without the memory module attached. And the photographer may be expected to easily attach the memory module to the standard film cartridge without having to be concerned about precise positioning of the module with respect to the terminal pins.

Although the present invention has been fully described with reference to the preferred embodiments thereof, many modifications and variations thereof will be apparent to those skilled in the art without departing from the spirit and scope thereof.

PARTS LIST FOR FIGS 1-6 camera body 10
viewfinder 12
terminal set $14_1$–$14_4$ of four terminals
read/write circuit 16
CPU 18
control line 20
data transfer bus 22
camera exposure platen 24
spool 26
film cartridge 30
film 32
memory module 40
concentric, ring-shaped, conductive bands $42_1$–$42_4$
upper printed circuit board surface 44
disc-shaped module housing 46
disc-shaped upper printed circuit board 46'
lower printed circuit board surface 48
non-conductive barrier band $50_1$–$50_4$
lead wires $52_1$–$52_4$
printed circuits $54_1$–$54_4$
through holes $58_1$–$58_4$
EEPROM chip 60
microcontroller 64
voltage regulator 66
I/O port section 68
foam disc 70
recess 72
lower foam disc surface 74
releasable contact adhesive layer 76

What is claimed is:

1. A memory module for a film cartridge in which information related to the camera exposure of film image frames may be recorded in non-volatile memory for subsequent read-out comprising:
   a disc-shaped module housing having an upper and a lower surface and a diameter generally corresponding to the diameter of an end of the film cartridge;
   a printed circuit formed in the pattern of a plurality of concentric, conductive bands spaced apart and electrically isolated from one another on the upper surface of the disc-shaped module housing;
   an integrated circuit chip, including a non-volatile memory, attached to the lower surface of the disc-shaped module housing and having a plurality of input and output terminals;

means for making electrical connections between the plurality of input and output terminals of the integrated circuit chip and the plurality of concentric conductive bands; and means for attaching the disc-shaped module housing to the end of a film cartridge so that the upper surface is exposed for making electrical contact with data recording and reading terminals of camera and film processing equipment.

2. The memory module of claim 1 wherein the attaching means further comprises a disc-shaped layer of insulating material having a first surface for contacting and enclosing the integrated circuit chip and a second surface for contacting the end of the film cartridge, the second surface having an adhesive layer thereon for adhering the memory module to the end of the film cartridge.

3. The memory module of claim 1 wherein the integrated circuit chip comprises an electrically erasable programmable read only memory.

4. A system for recording information related to the camera exposure parameters of film image frames in a detachable memory module attached to a film cartridge loaded in the camera in non-volatile memory for subsequent readout, wherein the module further comprises:

a disc-shaped module housing having an upper and a lower surface and a diameter generally corresponding to the diameter of an end of the film cartridge;

a printed circuit formed in the pattern of a plurality of concentric, circular conductive bands spaced apart and electrically isolated from one another on the upper surface of the disc-shaped module housing;

an integrated circuit chip, including a non-volatile memory, attached to the lower surface of the disc-shaped module housing and having a plurality of input and output terminals;

means for making electrical connections between the plurality of input and output terminals of the integrated circuit chip and the plurality of concentric conductive bands; and means for attaching the disc-shaped module housing to the end of a film cartridge so that the upper surface is exposed for making electrical contact with data recording and reading terminals of camera and film processing equipment; and wherein the camera further comprises:

a camera housing for receiving the film cartridge with the attached memory module in a cartridge receiving chamber;

a plurality of contact terminals positioned by the camera housing to extend into the cartridge receiving chamber and bear against and make electrical contact with the respective plurality of concentric conductive bands; and means for providing camera battery power and electrical signals to be stored in the non-volatile memory through the plurality of contact terminals and to the respective concentric conductive bands.

5. The system of claim 4 wherein the memory module further comprises a disc-shaped layer of insulating material having a first surface for contacting and enclosing the integrated circuit chip and a second surface for contacting the end of the film cartridge, the second surface having an adhesive layer thereon for adhering the memory module to the end of the film cartridge.

6. The system of claim 5 wherein the memory module integrated circuit chip comprises an electrically erasable programmable read only memory.

* * * * *